United States Patent [19]

Gordon, Jr.

[11] Patent Number: 4,871,062
[45] Date of Patent: Oct. 3, 1989

[54] PIN CARRIER

[75] Inventor: Herbert L. Gordon, Jr., Elizabethtown, Pa.

[73] Assignee: InterCon Systems, Inc., Harrisburg, Pa.

[21] Appl. No.: 280,338

[22] Filed: Dec. 6, 1988

[51] Int. Cl.4 .............................................. B65D 73/02
[52] U.S. Cl. ...................................... 206/328; 206/477
[58] Field of Search ............... 206/332, 334, 328, 443, 206/478, 480, 477; 439/395, 396, 404, 405, 417, 418, 861, 882; 29/857, 863

[56] References Cited

U.S. PATENT DOCUMENTS

| 2,694,799 | 11/1954 | Del Camp . | |
|---|---|---|---|
| 2,969,521 | 1/1961 | Scoville . | |
| 3,822,783 | 7/1974 | Mortensen | 206/480 |
| 3,918,790 | 11/1975 | Filson . | |
| 3,945,709 | 3/1976 | Filson . | |
| 4,002,388 | 1/1977 | Menocal . | |
| 4,037,915 | 7/1977 | Cabaud . | |
| 4,369,572 | 1/1973 | Atkins . | |
| 4,411,361 | 10/1983 | Mentzer | 206/480 |
| 4,548,459 | 10/1985 | Mosser, III | 439/395 |
| 4,573,569 | 3/1986 | Parker | 206/443 |
| 4,749,365 | 6/1988 | Magnifico et al. | 439/396 |

*Primary Examiner*—Stephen Marcus
*Assistant Examiner*—Jacob Ackun, Jr.
*Attorney, Agent, or Firm*—Thomas Hooker

[57] ABSTRACT

An elongate pin carrier forms physical and electrical connections with transversely oriented contact pins held in spring retaining members.

12 Claims, 1 Drawing Sheet

PIN CARRIER

BACKGROUND OF THE INVENTION

The invention relates to a carrier for holding and forming electrical connections with transversely positioned small diameter transversely positioned contact pins.

DESCRIPTION OF THE PRIOR ART

Contact pins are conventionally mounted transversely on carrier strips by forcing the pins into slots between pairs of fingers extending upwardly from the strip. The inserted pin forces the fingers apart and forms a physical and electrical connection between the strip and the pin. This type of force fit connection can involve high insertion and withdrawal forces, particularly when the preformed slot is narrow in comparison to the diameter of the inserted pin.

The size of the slot relative to the pin varies because of production tolerances in the stamp-formed carrier and, to a lesser degree, in the diameter of the pin. These inherent tolerances lead to situations where the slot is relatively small relative to the pin. Insertion of a pin into a narrow slot requires a high insertion force which can permanently deform the finger. A high withdrawal force is required. High insertion and withdrawal forces can damage pins.

Tolerance problems can also lead to a slot being relatively large with regard to an inserted pin so that the pin is not properly secured in the slot and may be accidentally dislodged from the slot. The electrical connection between a pin and a relatively large slot may be impaired.

Reduction in size of modern circuitry requires reduction in the diameter of contact pins and reduction in the size of carriers for the pins. The size of the pin retaining slots in the carriers is also reduced. However, reduction in the size of the carriers does not reduce the tolerances inherent in the manufacture of the carrier. As the size of the carrier is reduced the percentage variation in the size of the slot due to stamping tolerances increases, leading to the unsatisfactory condition where the slot may be either too large or too small for the pin. These problems render conventional pin carriers unsatisfactory for currently required pins having a relatively small diameter in the range of about 0.018 inch.

SUMMARY OF THE INVENTION

The invention is a stamp-formed pin carrier having pairs of opposed spring retention members with pin receiving slots between locating fingers and spring fingers. The locating fingers provide a locating surface for holding the pins inserted in the slots. The spring fingers include an elastically deformable spring beams which are deflected during insertion of the pins into the slot and which hold the pins against the locating fingers. The deflection of the springs is sufficient to assure that the pins are held accurately against the locating fingers despite dimensional variations due to production tolerances in the manufacture of both the pins and the carrier.

Other objects and features of the invention will become apparent as the description proceeds, especially when taken in conjunction with the accompanying drawings illustrating the invention, of which there is one sheet and one embodiment.

DESCRIPTION OF THE PREFERRED EMBODIMENT

Figure 1:
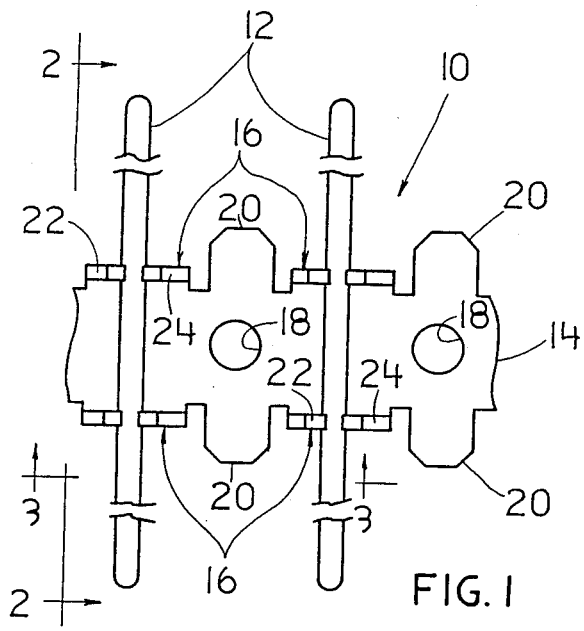
FIG. 1 is a top view of a portion of a pin carrier according to the invention.
Figure 2:
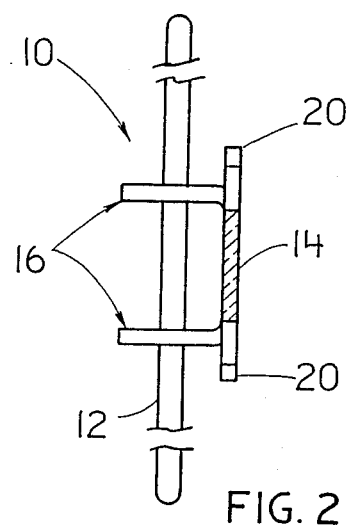
FIGS. 2 and 3 are partially broken away views taken along lines 2—2 and 3—3 of FIG. 1 respectively.

Elongate pin carrier 10 is stamp-formed from uniform thickness strip metal stock and removably supports a plurality of transversely extending contact pins 12. The carrier includes a continuous strip 14 with opposed pairs of pin retention members 16 regularly spaced along the length of the strip. The members are formed from the strip and are bent up at right angles to the strip. Pilot holes 18 are formed through the center of the strip between the member pairs and are used for feeding the strip during stamping. Carrier feed lugs 20 extend outwardly on both sides of the strip between and beyond adjacent pairs of retention members 16 and are used for feeding of the pin carrier during insertion of pins into the retention members. An appropriate feed device engages both opposed lugs to move the carrier longitudinally without skewing.

Each pin retention member 16 includes rigid locating finger 22, a spring retention finger 24 and an open pin-receiving slot 26 between the fingers. The open end of the slot faces away from strip 14. Chamfers 28 are provided in the ends of the fingers 22 and 24 to guide pin 12 into the slot 26.

A closed cutout opening 30 is formed through the thickness of the center of the finger 24 and extends along the length of the finger to define a rigid support post 32 on the side of the finger away from the pin slot and a flexible spring beam 34 facing the slot. The upper end of spring beam 34 is connected to the upper end of post 32. The lower ends of the spring beam and post are connected to the lower part of the spring finger.

Figure 4:
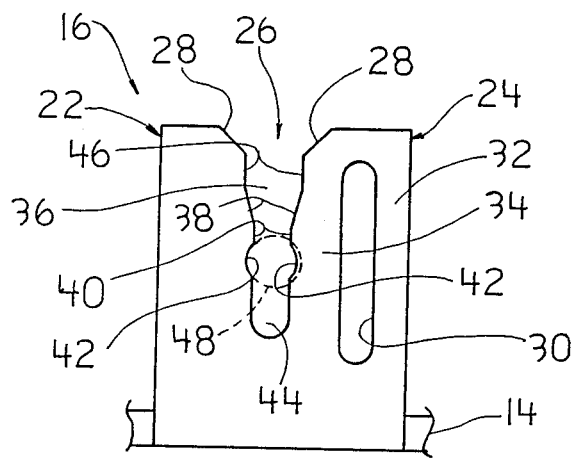
FIG. 4 is an enlarged side view of a pin retention member.

As shown in FIG. 4, slot 26 includes chamfered lead ins 28 at the slot mouth, a uniform width portion 36 extending into the slot from the mouth, shallow inwardly extending ramps 38 on both sides at the bottom of portion 36 and parallel lands 40 at the inner ends of the ramps. Opposed concave recesses 42 on both sides of the slot at the ends of the lands fit snugly around the cylindrical bodies of pins 12 inserted into the slots. One recess is on the center of the spring beam. The slot 26 extends inwardly to a bottom portion 44 located below the recesses 42. The opening 30 and slot 26 on opposite sides of the spring beam 34 to permit flexing of the beam about its upper and lower ends during insertion and withdrawal of pins 12 into and out of the slot.

Figure 3:
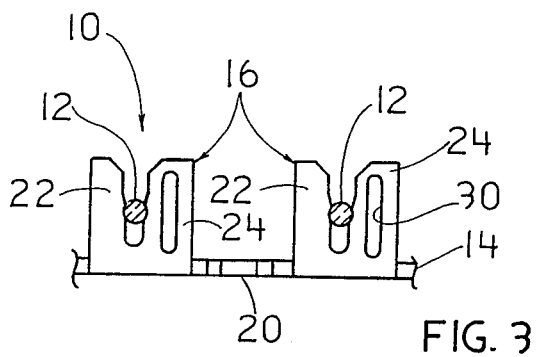

Pairs of pin retaining members 16 are bent up on opposite sides of the strip 14 with slots 26 in the members aligned to receive and hold pins 12 transversely to the strip as shown in FIG. 1. Pins are guided into the slot 26 through lead-ins 28 and down the uniform width portions 36 defined by parallel slot walls 46. These walls are spaced apart a sufficient distance so that the pins move past the walls with minimum engagement or injury to the pins. Further insertion of the pins into the slot engages the shallow ramps 38 to flex spring beams 34 into openings 30 without moving of the locating fingers 22. The pins are finally moved past lands 40 and fall into the pin recesses 42 as beams 34 flex back into the slots to confine the pins in the recesses as shown in FIG. 3.

In FIG. 4 dotted line 48 shows the position of a pin 12 inserted into the pin retention member. The spring beam 34 is correspondingly elastically bent into the opening 30 to accommodate the pin. Pins are withdrawn from the members by applying upward withdrawal force to elastically stress the beams 34 and allow the pins to be moved from the slot.

The spring beams 34 enable pin carrier 10 to receive and hold pins in accurate location against locating finger 22 despite conventional tolerances inherent in the manufacture of the carrier and of the pin. The spring holds the pin against the pin recess 42 in the locating finger 22. The position of this surface does not move during insertion of the pin or with tolerance variations in the spring or the diameter of the pin.

Pins are located on a length of carrier 10 with each pin in a desired location within a tolerance of plus or minus 0.001 inch for each pin. The pins are stripped from the carrier 10 one at a time and are mounted in a plastic header. The pins extend to either side of the header and are subsequently attached to adjacent circuit members.

The spring beams 34 are elastically deformed during insertion and withdrawal of the pins from the slots 26 providing a relatively constant per pin insertion force and withdrawal force. The force is relatively independent of accumulated dimensional manufacturing tolerances in the retention member and pin, thereby facilitating uniform production insertion and withdrawal of pins from the carrier. The pin carrier may be used to carry relatively small pins having a diameter of about 0.018 inch.

The pin carrier 10 forms a physical connection with pins 12 to orient and hold the pins perpendicularly to the strip in very accurately spaced regular intervals along the length of the strip. The members also form a biased electrical connection between the carrier and the pins so that the carrier may be fed through a plating bath to plate a metal coating on the pins through use of the electrical connections between the pins and strip.

While I have illustrated and described a preferred embodiment of my invention, it is understood that this is capable of modification, and I therefore do not wish to be limited to the precise details set forth, but desire to avail myself of such changes and alterations as fall within the purview of the following claims.

What I claim as my invention is:

1. A pin carrier formed from metal strip stock comprising
   (a) an elongate strip; and
   (b) a first plurality of pin retention members extending from the strip at regular intervals along the length of the strip, each member having
      i. a locating finger,
      ii. a spring finger spaced from the locating finger to define an open ended pin-receiving slot between the fingers,
      iii. the spring finger including a rigid post away from the slot having an end adjacent the open end of the slot and a spring beam spaced from the post and extending along one side of the slot, one end of the spring beam joining the end of the post and the other end of the spring beam joining the spring retention finger at the bottom of the slot, said spring beam being spaced from the post to permit flexing of the spring beam away from the slot, and
      iv. a first pin contact surface on the center of the spring beam facing the slot and a second pin contact surface on the surface of the locating finger facing the slot across from the first pin contact surface.

2. A pin carrier as in claim 1 wherein each retention member includes a opening separating the post and spring beam whereby the spring beam is free to flex into the opening upon insertion of a contact pin into the slot.

3. A pin carrier as in claim 2 wherein in each retention member one pin contact surface is concave to retain a pin in the slot.

4. A pin carrier as in claim 3 including a ramp formed on the side of each slot between the concave surface and the open end of the slot.

5. A pin carrier as in claim 3 wherein the width of each slot adjacent the open end of the slot is greater than the width of the slot between the surfaces.

6. A pin carrier as in claim 5 wherein said first plurality of pin retention members all extend from one side of the strip and are bent up perpendicular to the strip; and including a second plurality of pin retention members each like the prior-described pin retention members and extending from the other side of the strip and bent up perpendicular to the strip and being individually located across from the first plurality of pin retention members so that a plurality of pins mounted on the carrier extend transversely across the strip with each pin fitted in a pin retention member of each plurality of pin retention members.

7. A pin carrier as in claim 2 wherein both pin contact surfaces of each retention member are concave and including ramps on the sides of the slots between the surfaces and the open end of the slot.

8. A pin carrier as in claim 7 including opposed pairs of feed lugs located between opposed pairs of retention members and extending outwardly from the strip beyond the retention members.

9. A pin carrier as in claim 1 wherein one pin contact surface in each retention member is concave.

10. An integral pin carrier formed from sheet metal stock comprising an elongate strip; feed means located at regular intervals along the strip for feeding the pin carrier longitudinally without skewing; opposed pairs of spaced pin retention members located at regular intervals along the length of the strip and joined to both sides of the strip; said pin retention members extending to one side of the strip, each pin retention member including a locating finger and a spring retention finger spaced from the locating finger to define a pin-receiving slot, the spring retention finger including a flexible spring beam extending along the slot and having a central contact surface facing the interior of the slot engagable with a pin moved into the slot and opposed ends joined to the remainder of the spring finger, said spring beam being otherwise free of the remainder of the spring finger to permit flexing away from the slot by a pin inserted into the slot.

11. A pin carrier as in claim 10 including a opening formed through the thickness of the spring finger away from the slot whereby the spring is free to flex into the opening.

12. A pin carrier as in claim 11 wherein the contact surface is concave and including a ramp between the surface and the open end of the slot.

* * * * *